United States Patent
Allenstein et al.

(10) Patent No.: US 9,974,189 B2
(45) Date of Patent: May 15, 2018

(54) METHOD AND SYSTEM OF PRODUCING A MULTILAYER ELEMENT AND MULTILAYER ELEMENT

(71) Applicant: 3D-Micromac AG, Chemnitz (DE)

(72) Inventors: Frank Allenstein, Chemnitz (DE); Maurice Clair, Plauen (DE); Tino Petsch, Chemnitz (DE); Rocco Kundt, Geringswalde (DE)

(73) Assignee: 3D-Micromac AG (DE)

( * ) Notice: Subject to any disclaimer, the term of this patent is extended or adjusted under 35 U.S.C. 154(b) by 0 days. days.

(21) Appl. No.: 14/915,338

(22) PCT Filed: Aug. 8, 2014

(86) PCT No.: PCT/EP2014/067104
§ 371 (c)(1),
(2) Date: Feb. 29, 2016

(87) PCT Pub. No.: WO2015/028289
PCT Pub. Date: Mar. 5, 2015

(65) Prior Publication Data
US 2016/0212858 A1 Jul. 21, 2016

(30) Foreign Application Priority Data

Aug. 30, 2013 (DE) .................. 10 2013 217 348

(51) Int. Cl.
*H05K 1/03* (2006.01)
*H05K 3/04* (2006.01)
(Continued)

(52) U.S. Cl.
CPC ........... *H05K 3/04* (2013.01); *B32B 37/1292* (2013.01); *B32B 38/10* (2013.01);
(Continued)

(58) Field of Classification Search
CPC .......... H05K 3/04; H05K 3/046; H05K 1/028; B32B 38/10; B32B 37/1292
(Continued)

(56) References Cited

U.S. PATENT DOCUMENTS

| 5,800,724 A | 9/1998 | Habeger et al. |
| 2007/0012775 A1 | 1/2007 | Cote |

(Continued)

FOREIGN PATENT DOCUMENTS

| DE | 697 34 328 T2 | 7/2006 |
| DE | 10 2009 001 221 A1 | 9/2010 |

(Continued)

OTHER PUBLICATIONS

Search Report dated Dec. 11, 2013 of corresponding German Patent Application No. 10 2013 217 348.2.

(Continued)

*Primary Examiner* — Tremesha S Willis
(74) *Attorney, Agent, or Firm* — DLA Piper LLP (US)

(57) ABSTRACT

A method of producing a multilayer element with a substrate and at least one conductor structure connected in an areal manner to the substrate, which has first regions of electrically conductive material present in accordance with a prescribed pattern, electrically non-conductive second regions lying between the first regions to produce RFID antennas or flexible printed circuit boards in a roller-to-roller process, the method including connecting a conductor foil to the substrate by a laterally structured layer of adhesive lying in between such that in first regions a partial bonding contact between the substrate and the conductor foil is created at a multiplicity of bonding zones, and in laterally extended second regions the conductor foil is not connected or is connected less firmly by adhesive to the substrate; structuring the conductor foil by cutting the conductor foil along
(Continued)

boundaries of the first regions; and removing contiguous pieces of foil of the conductor foil from laterally extended second regions.

19 Claims, 4 Drawing Sheets

(51) Int. Cl.
    *B32B 37/12*     (2006.01)
    *B32B 38/10*     (2006.01)
    *G06K 19/077*     (2006.01)
    *H05K 1/02*     (2006.01)
    *H05K 3/02*     (2006.01)

(52) U.S. Cl.
    CPC . *G06K 19/07718* (2013.01); *G06K 19/07722* (2013.01); *G06K 19/07749* (2013.01); *G06K 19/07773* (2013.01); *G06K 19/07786* (2013.01); *H05K 1/028* (2013.01); *H05K 1/0298* (2013.01); *H05K 3/046* (2013.01); *B32B 2310/0843* (2013.01); *B32B 2457/08* (2013.01); *B32B 2519/02* (2013.01); *H05K 3/027* (2013.01); *H05K 2203/107* (2013.01); *H05K 2203/1545* (2013.01)

(58) Field of Classification Search
    USPC .......................... 174/255, 250, 251, 256–261
    See application file for complete search history.

(56) References Cited

U.S. PATENT DOCUMENTS

| | | | |
|---|---|---|---|
| 2007/0062639 A1 | 3/2007 | Chang et al. | |
| 2015/0144379 A1 | 5/2015 | Petsch et al. | |

FOREIGN PATENT DOCUMENTS

| | | |
|---|---|---|
| EP | 0 790 123 B1 | 8/1997 |
| JP | 6-8366 A | 1/1994 |
| WO | 2007/060298 A1 | 5/2007 |
| WO | 2009/118455 A1 | 10/2009 |
| WO | 2011/003518 A1 | 1/2011 |
| WO | 2013/178588 A1 | 12/2013 |

OTHER PUBLICATIONS

The First Office Action dated Feb. 3, 2017, of corresponding Chinese Application No. 201480059766.5, along with an English translation.

METHOD AND SYSTEM OF PRODUCING A MULTILAYER ELEMENT AND MULTILAYER ELEMENT

TECHNICAL FIELD

This disclosure relates to a method of producing a multilayer element with a substrate and at least one conductor structure connected in an areal manner to the substrate, a system that produces such a multilayer element and a multilayer element that can be obtained by the method.

BACKGROUND

A preferred field of application is the production of antennas for radio-frequency identification systems (RFID antennas), flexible printed circuit boards or other multilayer elements that can be produced by lamination and have conductive structures, for example, for electrical circuits by using flexible substrates in strip form in a roller-to-roller process.

In the production of electrical or electronic components for mass applications, it is endeavored to provide the desired electrical functionality in good quality with the lowest possible production costs. In one class of production methods, a laminate is produced as an intermediate product by a conductor foil, in particular a metal foil, being connected to the substrate by a layer of adhesive lying in between. Subsequently, the conductor foil is structured by being severed by a suitable separating process, for example, laser cutting, punching and the like at the boundaries of those regions intended to later form the conductor structure. In many cases, this involves creating relatively large pieces of foil that do not belong to the end product and accordingly have to be removed from the intermediate product before further method steps can follow.

EP 0 790 123 B1 and corresponding DE 697 34 328 T2 describe a method of producing a laminate from a patterned metal foil and a substrate in which a metal foil web is laminated onto a substrate by an adhesive being introduced between the metal foil and the substrate in a predetermined pattern. The pattern defines regions in which adhesive is present and regions in which no adhesive is present. Subsequently, the metal foil is cut into a pattern corresponding to the boundaries of the regions containing the adhesive. The cutting may take place, for example, by rotational punching or laser cutting. Those regions of metal foil not adhesively attached to the substrate by the adhesive are subsequently removed, for example, by suction.

WO 2009/118455 A1 discloses other methods of the generic type. In one variant of that method, a conductor foil is selectively fastened to the substrate material, desired regions of the end product that form the final conductor structure and narrow regions between the conductive regions of the end product being connected to the substrate by an adhesive, and laterally extended regions of the foil intended to be removed later remaining largely unconnected to the substrate, such that they are at most connected to the substrate in a peripheral region removed in a later structuring step. Subsequently, the conductor foil is structured by material removal, namely removing material from narrow regions between the desired regions of the conductor structure and the outer periphery of the larger foil regions intended to be removed from the piece later to create the conductor structure. After that, the pieces of foil no longer fastened to the substrate are removed since the peripheral region of these pieces of foil that was removed from the outer periphery of these pieces of foil during the structuring operation no longer securely holds the pieces of foil on the substrate.

It could therefore be helpful to provide a method and a system of producing a multilayer element that allow production of high-quality multilayer elements with a high degree of reliability of the process at low production costs.

SUMMARY

We provide a method of producing a multilayer element with a substrate and at least one conductor structure connected in an areal manner to the substrate, which has first regions of electrically conductive material present in accordance with a prescribed pattern, electrically non-conductive second regions lying between the first regions to produce RFID antennas or flexible printed circuit boards in a roller-to-roller process, the method including connecting a conductor foil to the substrate by a laterally structured layer of adhesive lying in between such that in first regions a partial bonding contact between the substrate and the conductor foil is created at a multiplicity of bonding zones, and in laterally extended second regions the conductor foil is not connected or is connected less firmly by adhesive to the substrate; structuring the conductor foil by cutting the conductor foil along boundaries of the first regions; and removing contiguous pieces of foil of the conductor foil from laterally extended second regions.

We also provide a system that produces a multilayer element with a substrate and at least one conductor structure connected in an areal manner to the substrate, which has first regions of electrically conductive material present in accordance with a prescribed pattern, electrically non-conductive second regions lying between the first regions to produce RFID antennas or flexible printed circuit boards in a roller-to-roller process, including devices that connect a conductor foil to the substrate by a laterally structured layer of adhesive lying in between such that in the first regions there is a partial bonding contact between the substrate and the conductor foil at a multiplicity of bonding zones, and in laterally extended second regions the conductor foil is not connected or connects less firmly by adhesive to the substrate; a device that structures the conductor foil by cutting the conductor foil along boundaries of the first regions; and a cleaning device that removes pieces of foil of the conductor foil from laterally extended second regions.

We further provide a multilayer element including an RFID antenna or a flexible printed circuit board produced by the method.

BRIEF DESCRIPTION OF THE DRAWINGS

FIG. 1 shows in FIG. 1A a schematic view of a first subsystem of an example of a system of producing laminated multilayer elements, in FIG. 1B a plan view of a substrate partially coated with adhesive and in FIG. 1C a section through a laminate.

FIG. 2 shows in FIG. 2A a schematic view of a second subsystem of the system and in FIG. 2B a section through a laminate structured by laser machining.

FIG. 3 shows in FIG. 3A an example of a layout of an RFID antenna that can be produced by the method and in FIG. 3B an enlarged detail of the contacting region of the antenna from FIG. 3A with bonding zones of different adhesive materials.

FIG. 4 shows in FIGS. 4A to 4E various spatial distributions of bonding zones in first regions partially coated with adhesive.

In our method, the conductor foil connects to the substrate by a three-dimensionally structured layer of adhesive lying in between such that in first regions, which in the end product are intended to have the desired electrically conductive conductor material, a partial bonding contact between the substrate and the conductor foil is created at a multiplicity of bonding zones distributed over the first region. Lying between bonding zones are intermediate regions in which there is no adhesive. In laterally extended second regions intended to be electrically non-conductive on the end product, on the other hand, only less bonding contact or no bonding contact at all is produced between the substrate and the conductor foil. There is therefore no application of adhesive, or adhesive is only applied at few locations to produce only a weak bonding contact which, in any event, is less than the bonding contact in the first regions.

After that, the conductor foil is structured by cutting or separating the conductor foil along boundaries of the first regions, whereby those regions forming the desired conductor structure on the finished product are machined out from the previously contiguous conductor foil. These regions remain adhesively attached at the bonding zones of the first regions. The adhesive-free intermediate regions lying between the bonding zones may be bridged by the conductor foil.

In this structuring operation, pieces of foil of the conductor foil adjoining the regions with the conductor structure are exposed in laterally extended second regions. These pieces of foil are removed from the laterally extended second regions after the structuring operation. Since there is no or only little bonding force in the second regions, because only little or no adhesive at all was applied there, this detachment is easily possible. The detaching force is set such that pieces of foil in the first regions are not detached, but are securely held reliably on the substrate in the region of the bonding zones.

The term "bonding zones" refers to zones of a relatively small area in which a bonding contact imparted by adhesive exists between the substrate and the conductor foil. Bonding zones are at a lateral distance from one another in at least one direction lying in the surface area so that there is an adhesive-free intermediate region. Bonding zones may be relatively small and, for example, have at its narrowest location a diameter of 10 µm to 300 µm, if appropriate even less or more. The size may depend on particulars of the production technique (for example, screen-printing or ink-jet process).

A "laterally extended second region" typically has in a number of directions an extent greater by a multiple than the cut width of the structuring operation, for example, at least 10 times or at least 100 times or at least 1000 times as great. The extent of laterally extended regions may, for example, be at least 300 µm or at least 500 µm or at least 1 mm at the narrowest location and/or at least 10 mm at the widest location. For example, in conductor structures that are uninterrupted in the circumferential direction, as are occasionally used for antennas or coils, laterally extended second regions may lie in the interior of the conductor structure. Greater laterally extended second regions may also lie between conductor structures that lie adjacent at a distance from one another on the same substrate.

In some applications there are also second regions of smaller lateral dimensions, for example, between closely adjacently extending conductor tracks of the conductor structure. In these second regions, the conductor material may be already removed in the structuring operation, for example, by laser ablation (material removal by laser radiation).

The method offers numerous advantages. Since full-area adhesive application does not take place in the first regions, but only partial adhesive application, with largely the same thickness of the layer of adhesive, adhesive can be saved to a considerable extent compared to known methods. Since the adhesive costs may make up a considerable part of the material costs in the production of multilayer elements of the generic type, costs can be saved. At the same time, our multilayer elements with the same structure of the conductor foil and the same thickness of the layer of adhesive can be lighter than comparable conventional multilayer elements. The weight reduction compared to conventional multilayer elements can bring advantages in the transport and storage of large numbers of multilayer elements and in use. Furthermore, the range of adhesives that can be used in principle can be widened. While in full-area layers of adhesive on flexible substrates it also has to be ensured that the adhesive is sufficiently flexible or extendable in the cured state, to avoid adhesive rupture, in our methods, more brittle adhesives can also be used since the adhesive material is only present in the relatively small regions of the bonding zones not subjected to flexural loading, or scarcely so. Interruption of the layer of adhesive in the first regions between the bonding zones also leads to better bendability of the finished multilayer elements since in the much interrupted layer of adhesive there lie predefined interruption zones (intermediate regions), which would bend with preference under flexural loading.

To achieve sufficient bonding force in the first regions, adhesive is preferably applied such that an area fraction of adhesive for creating the bonding zones within the first regions is 10% to 90%, in particular 20% to 80%. Within these limits, a good compromise between sufficient adhesive force and saving adhesive is generally possible.

In some variants, no adhesive is applied in regions that correspond to laterally extended second regions so that these regions are free of adhesive on the finished multilayer element. This preferably applies to all laterally extended second regions, but some of these regions can also contain some adhesive. These variants may be particularly advantageous, for example, with regard to adhesive costs, total weight and flexibility of the multilayer element.

It is also possible to produce a partial bonding contact between the substrate and the conductor foil in some or all of the laterally extended second regions by adhesive being applied in accordance with a prescribed pattern to create a spatial distribution of bonding zones with adhesive-free intermediate regions lying in between. To ensure that during cleaning contiguous pieces of foil are only removed from the laterally extended second regions, the area fraction of adhesive to create the bonding zones should be much smaller than the area fraction of the adhesive material in the first regions. For example, an area fraction of adhesive to create bonding zones or the degree of coverage of these regions within the laterally extended second regions may lie at less than 30%, for example, 1% to 5%, while the area fraction or degree of coverage in the first regions is 20% or more, and for example, is 40% to 90%.

A laterally structured layer of adhesive is applied to the substrate and/or to the conductor foil before connecting the conductor foil to the substrate to create the bonding zones. Application exclusively to the substrate is in many cases advantageous, in particular whenever the substrate is much thicker and/or mechanically more stable than the conductor foil. Alternatively, it is also possible to apply a layer of adhesive exclusively to the side of the conductor foil to be turned toward the substrate which may be advantageous in particular whenever the conductor foil is thicker and/or mechanically more stable than the substrate material. It is also possible to apply one fraction of the layer of adhesive to the substrate and another fraction to the conductor foil, the fractions then together making up the desired laterally structured layer of adhesive when connecting takes place.

Depending on the application or the structure of the multilayer element, the adhesive material may be applied in the first regions to create the bonding zones partially in accordance with a prescribed pattern, which satisfies one or more prescribed conditions. The pattern may, for example, contain a regular or irregular pattern of points or be formed by such a pattern. The form of the points or of the finished bonding zones as it appears in plan view may, for example, be circular or oval, if appropriate also polygonal, for example, rectangular or square. Irregular forms which may, for example, be obtained by the running of a drop of adhesive, are also possible.

It is also possible that the pattern contains a regular or irregular pattern of lines or is formed by such a pattern. The lines may be straight lines or singly or multiply curved lines. A mixture of patterns of points and patterns of lines is also possible.

The spatial density of pattern elements (for example, points and/or lines) within the first regions may be substantially uniform, but it may also vary spatially so that there are regions with a greater density of bonding zones or a greater area fraction of bonding zones along with regions with a smaller area fraction of bonding zones. This also allows a non-uniform spatial distribution of the adhesive forces to be created within the first regions, if so desired.

In some variants, the layer of adhesive is applied in some or all of the first regions such that, in the region of peripheral zones of the first regions, linear bonding zones adapted to the path of the periphery are created, normally being uninterrupted over relatively great distances in the direction of the path of the periphery. The length of a linear bonding zone is typically a multiple of the width of the linear bonding zone. In the interior, i.e., further away from the peripheral zones, there may be a pattern of points or a pattern of lines. Such linear bonding zones at the periphery of first regions may have the effect of reliably avoiding or hindering unintentional detachment of the conductor foil in the peripheral zones of the first regions.

To create a laterally structured layer of adhesive, a jet printing process analogous to inkjet printing may be used, for example. This digital printing process offers a high degree of flexibility in the design of the laterally structuring pattern of adhesive to be applied and can be used particularly when using adhesives of low viscosity. If appropriate, adhesives may be diluted for this purpose. A pattern of adhesive substance may also be applied by a flexographic printing process, that is to say by a web-fed rotary printing process in which a flexible printing plate with a raised pattern can be used to apply the adhesive. The flexible stamping roller rolls on the material to be printed (substrate or conductor foil) and thereby creates the desired pattern of adhesive. This variant of the method of applying adhesive may be economically advantageous, particularly in series with very large numbers of items. Alternatively, the adhesive may also be applied by a screen printing process or an offset printing process with suitable lateral distribution, if appropriate also by slot-die coating or intaglio printing processes, for example, gravure printing.

A particularly high degree of flexibility in the way of conducting the method is obtained in some examples by creating a laterally structured multilayer of adhesive, which in the region of first bonding zones consists of a first adhesive material and in the region of second bonding zones, separate from the first consists of a second adhesive material, which differs from the first adhesive material. The adhesive materials may, for example, differ with regard to their ability to bond to the substrate and/or to the conductor foil and/or with regard to their brittleness in the cured state and/or their shrinkage behavior during curing.

Advantages can also be obtained if certain regions of the multilayer element are to be used as contacting regions for the later attachment of electronic components such as, for example, semiconductor chips. Increased thermal stability of the adhesive material is often required in these regions so that the adhesive material does not fail during subsequent contacting operations by soldering, bonding and the like. Suitable temperature-resistant adhesive materials are generally more expensive than adhesive materials that do not have to be designed for higher temperatures. Using two or more different adhesive materials to create the layer of adhesive allows production costs to be kept moderate without restrictions on the functionality of the multilayer elements.

To be able to apply different adhesive materials in a continuous process, the devices that connect the conductor foils to the substrate have in preferred examples a first adhesive applying device to apply a first adhesive material to create first bonding zones and at least one second adhesive applying device to apply a second adhesive to create second bonding zones, separate from the first. The first and second bonding zones can then together make up the desired overall pattern. Providing two or more adhesive applying devices generally has the effect of increasing the costs of the installation. In particular in the production of large numbers of multilayer elements as is usual, for example, in the area of the production of RFID antennas, these additional investment costs can be quickly paid off by making savings in the costs of adhesive materials. In addition, there is the possibility of creating laterally structured layers of adhesive having two or more laterally offset regions with different adhesive materials, whereby the properties of the layer of adhesive can be adapted even better to requirements.

For the structuring of the conductor foil, various separating processes or cutting processes may be used, for example, punching processes or mechanical cutting processes. Preferably, structuring of the conductor foils takes place by radiating laser radiation along the boundaries of the first regions by a process of laser machining. In such cases, the system comprises a corresponding laser machining system. It may be, for example, a scanner system or a mask projection system.

When cutting the conductor foil along boundaries of the first regions, the laser machining system is normally operated in a first operating mode in which the laser beam is focused such that the focal area on impingement on the conductor foil has a relatively small diameter in the range of, for example, 10 μm to 150 μm. This allows the contour of the conductive regions of the finished multilayer element to be prescribed particularly precisely. Furthermore, it is intended here generally that only the conductor foil is severed with the aid of the laser beam so that there form relatively large contiguous pieces of foil that can then be detached in a downstream cleaning operation.

However, it is also possible in principle with the aid of a laser machining system to carry out wider cuts and/or remove larger contiguous regions successively over the full surface area by scanning and/or in certain regions to vaporize both the conductor foil and the adhesive material lying thereunder. For this, the laser machining system of preferred examples is designed such that it can be changed over between a first operating mode (for passing along the boundaries of the first regions) and at least one second operating mode to machine other regions under other irradiation conditions. To change the operating mode, it is possible, for example, by switching over into another optical setup, to change the focal setting. To adapt the energy density in the focal area, it is then generally advisable to change over the power output and/or the repetition rate of the laser source. A laser machining system that can be changed over can improve the flexibility in the structuring of the conductor foil.

It is also possible to provide in addition to a first laser machining system at least one second laser machining system, which at the same time as the first laser machining system or at a time thereafter machines other regions to be structured than the first laser machining system.

These and other features emerge not only from the appended claims, but also from the description and the drawings, where individual features can be realized by themselves or as a plurality in the form of subcombinations in an example and in other fields and can constitute advantageous and inherently protectable examples. Examples are represented in the drawings and are explained in more detail below.

DETAILED DESCRIPTION

Figure 1A:
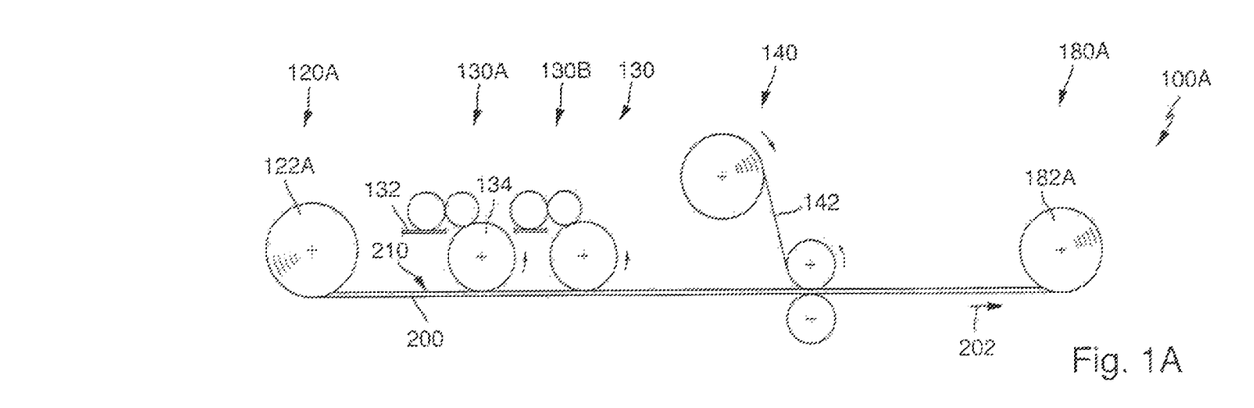
Figure 2A:
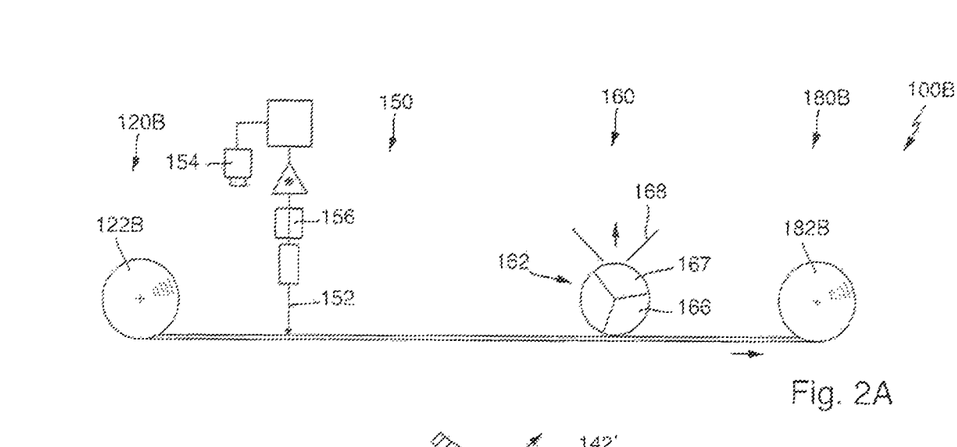

In FIG. 1A, a first subsystem 100A of an example of a system of producing laminated multilayer elements on flexible substrates in strip form in a roller-to-roller process is shown. The first subsystem includes devices that produce a laminate. FIG. 2A shows an associated second subsystem 100B of the system that carries out downstream process steps (for example, structuring and cleaning) on a laminate produced in the first subsystem. The two subsystems are operational independently of one another and may be set up spatially separately from one another, for example, in different rooms of a plant or even at different sites of the same company or of different companies.

The system (system as a whole), which includes the first subsystem and the second subsystem, is configured for the production of antennas for radio-frequency identification systems (RFID antennas), but may also be used to produce other multilayer elements that can be produced by lamination and have conductive structures, for example, for electrical circuits on flexible (bendable) substrates. For example, with a corresponding configuration, multisided flexible printed circuit boards, capacitors, electrodes of printed batteries, sensors, for example, strain gages, or actuators can also be produced.

In the example, the system of a modular construction processes in a divided production line a flexible substrate 200, which is in the form of a long flat strip and may be formed, for example, by a film of plastic or a paper web. In specific applications, other non-conductors or foils made of metal or with metal layers can also be used as the substrate.

The fresh, still unmachined substrate material is unrolled from an actively driven storage roller 122A of the first subsystem 100A located in an unwinding device 120A on the input side of the first subsystem 100A. From there, the substrate is transported continuously through various devices or modules of the first subsystem in transporting direction 202 up to a winding-up roller 182A located in a winding-up device 180A at the end of the first subsystem 100A. With the aid of the devices or modules of the first subsystem, a conductor foil is laminated onto the substrate by a laterally structured layer of adhesive.

An adhesive applying device 130 is configured to apply a thin layer of adhesive on the upper side 210 of the still untreated substrate running through over a prescribed working width, which is generally less than the strip width of the substrate. In a downstream laminating device 140, a conductor foil 142, for example, an aluminum foil or some other metal foil, is applied under pressure to the layer of adhesive so that the conductor foil connects to the substrate by the layer of adhesive lying in between. A laminate is thereby produced.

The resultant, still unstructured laminate is wound up onto the winding-up roller 182A. Then, if appropriate after intermediate storage, this roller is used as a storage roller 122B of the second subsystem 100B as shown in FIG. 2A. With the aid of the devices or modules of the second subsystem 100B, the laminate is structured and cleaned.

In a laser machining device 150, the laminated-on metal foil (conductor foil) of the laminate unrolled from the storage roller 122B of the unwinding device 120B is laterally structured by the conductor foil being severed by a laser beam at the boundaries of those regions intended to form the desired conductor structure of the finished RFID antenna. Depending on the layout of the conductor structure, this involves producing pieces of foil of a greater or smaller size of the metal foil that do not belong to the desired end product, and therefore have to be removed. Other structuring operations may also be carried out by a laser.

Provided for cleaning, i.e., to remove the pieces of foil, is a downstream cleaning device 160, which in the example has a cleaning roller 162 working by negative pressure and positive pressure and a suction-removal device 168.

The resultant, structured and cleaned laminate is wound up onto the winding-up roller 182B of the winding-up device 180B.

The adhesive applying device 130 is configured such that a laterally structured layer of adhesive with coated regions and uncoated regions can be applied to the upper side 210 of the substrate. For this purpose, the adhesive applying device has a first printing unit designed for flexographic printing in which adhesive liquid is transferred from an adhesive store 132 by way of a roller unit to a printing form cylinder 134 that carries a flexible printing plate with raised structures that transfers the adhesive to the upper side of the substrate.

Figure 3A:
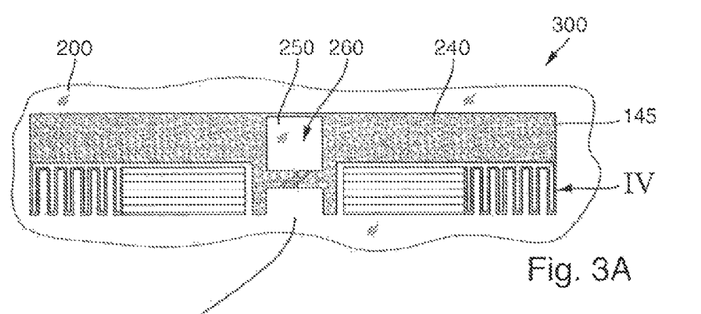

The system is configured to produce multilayer elements in the form of RFID antennas. FIG. 3A shows the conductor structure of an example of an RFID antenna 300 after the structuring operation by way of example in plan view. The conductor structure 145 laminated onto the substrate 200 appears dark. Those regions in which the conductor structure remains on the finished product are referred to here as first regions 240. Those regions lying adjacent to the first regions intended to be electrically non-conductive in the finished product and appear light in FIG. 3A are referred to as second regions 250. The second regions may be divided once again into relatively narrow second regions that lie in particular between conductor tracks of the conductor structure, running parallel to one another, and laterally extended second regions, the extent of which is typically many times greater than the width of conductor tracks or the width of narrow regions lying between the conductor tracks.

Figure 3B:
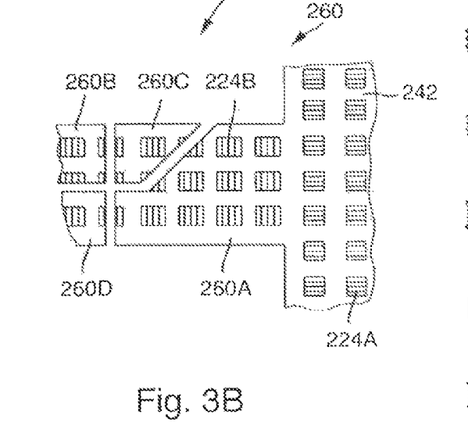

The generally rectangular regions lying to the left and right of the middle serve as antenna elements. In the middle between the antenna elements there lies a contacting region 260 also referred to as a "pad area" and serves the purpose of electrically contacting an RFID chip with the metallic antenna structure by soldering, bonding or the like. A detail of the contacting region 260 is shown enlarged in FIG. 3B. The contacting region has four portions 260A to 260D electrically separated by narrow conductor-free paths of which the portions 260A and 260B go over directly into the antenna portions 242 adjoining them. The RFID antenna with the RFID chip connected to it forms a transponder of an RFID system which can, for example, be attached to or provided in an article for the identification thereof and contains a code identifying the article, which can be read out wirelessly by way of an external reader.

In producing this RFID antenna, the conductor foil intended later to form the electrically conducting regions is fastened to the substrate with the aid of a laterally structured layer of adhesive 220. The term "laterally structured" means that the layer of adhesive is not over the full surface area or uninterrupted in the lateral direction, that is to say in the direction of the extent of the layer, but is multiply interrupted so that only part of the surface of the substrate is covered with adhesive material (partial adhesive application). In this case, adhesive material (adhesive substance) is only applied with the aid of the adhesive applying device 130 in the first regions 240, while no adhesive is applied in the laterally extended second regions 250 intended to be electrically non-conductive in the finished product.

Figure 1B:
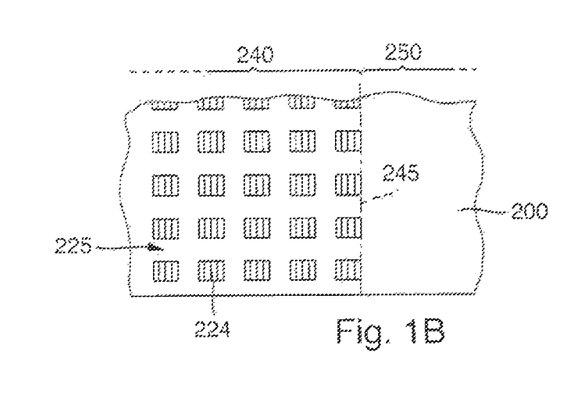

FIG. 1B shows by way of example the region of a boundary 245 between a first region 240 and a second region 250. Within the first region 240, however, the adhesive is not applied over the full surface area. Rather, the adhesive is only applied in point form to form a grid-like pattern of relatively small bonding zones 224 between which intermediate spaces 225 free of adhesive in the lateral direction remain. The area ratio between the total area of all the bonding zones of a unit area of a first region to the total area of this unit area is also referred to here as the "degree of coverage" so that a degree of coverage of 100% corresponds to an application of adhesive over the full surface area. According to the application and adhesive force requirement, degrees of coverage within the first regions may lie between virtually full-area application of adhesive (for example, a degree of coverage of 90%) and a 10% degree of coverage, if appropriate even less, for example, down to a 5% degree of coverage. The degree of coverage is often 20% to 80%. Apart from the degree of coverage, the form and size of the bonding zones and their lateral distribution within the first regions may also be adapted to requirements. Further examples are explained in more detail in conjunction with FIGS. 3 and 4.

One production method may, for example, involve the use of a pressure sensitive adhesive (PSA), which after application of adhesive is also activated by pressure while irradiating with UV radiation. The use of thermally activatable adhesives is also possible. The thickness of the layer of adhesive may, for example, be 1 µm to 50 µm, in particular 5 µm to 20 µm. The thickness of the conductor foil is typically smaller than the thickness of the layer of adhesive and may, for example, be 5 µm to 100 µm, in particular 5 µm to 40 µm. In the example of an RFID antenna, the width of the conductor material webs may, for example, be 0.1 mm to 30 mm, in particular 0.5 mm to 20 mm. The lateral distance between adjacent bonding zones may be of the same order of magnitude, but is often greater than the width of the conductor material web.

Figure 1C:
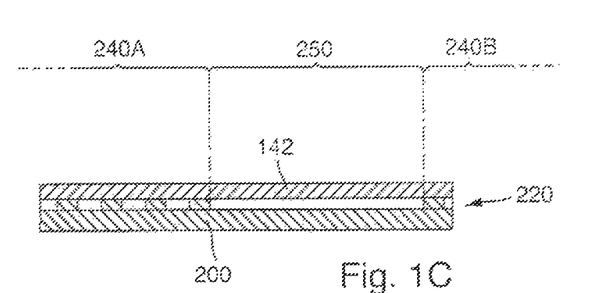

After application of adhesive and a possible downstream post-treatment, the conductor foil 142 is applied to the layer of adhesive in a continuous process in the laminating device 140 and, in this way, connects to the substrate 200 by way of the laterally structured layer of adhesive. FIG. 1C shows a perpendicular section through a detail of a laminate produced in this way. In the first regions 240, the conductor foil 142 bonds to the substrate in the region of the bonding zones 224 lying laterally at a distance from one another, while the narrow adhesive-free intermediate regions 225 are bridged by the conductor foil. In the laterally extended second regions 250, there is no bonding contact between the conductor foil and the substrate so that the conductor foil is made to extend freely over the substrate between laterally adjacent first regions 240A, 240B and, depending on the extent of the second region and the thickness of the layer of adhesive, may also partially lie on the substrate.

The finished laminate is an intermediate product that can be wound up onto the winding-up roller 182A at the end of the first subsystem 100A and transported away for further processing.

In the example, the further processing takes place in the second subsystem 100B. A winding-up roller, with laminate, removed from the first subsystem 100A is used in the unwinding device 120B as a storage roller 122B. The laminate unrolled from the storage roller 122B and transported continuously in the transporting direction 202 is structured with the aid of the laser machining device or a laser machining system 150 to create in the conductor foil the desired target contour, i.e., the desired conductor structure. In the example, the laser machining device 150 is configured as a laser scanner and generates a focused laser beam 152, which serves as a separating tool and is guided by a scanning device along the boundaries of the conductor structure to be created. Typical cut widths in a focused laser beam may in this cutting operation be 1 µm to 250 µm, in particular 10 µm to 100 µm. The laser power output is set such that the material of the conductor foil is vaporized without the substrate lying thereunder being attacked. The layer of adhesive may be partially or completely vaporized, but it may also remain. In the example, the laser machining system 150 comprises at least one camera 154 with which the laser machining operation can be monitored. Corrections in the control of the laser machining may be performed on the basis of image data of the camera. In the example, the camera is arranged upstream of the laser machining unit and observes the substrate web or laminate web before it runs into the machining region (scanner region) of the laser system. This makes it possible to position the scanner region on the basis of special markings at the periphery of the substrate web. This alignment is intended for the achievement of highest positional accuracy of the cuts since the laminate web running through can generally move back and forth in the transverse direction by up to 1 mm or more, while the desired positioning accuracy for the cuts is much lower, and may, for example, be 10 µm to 50 µm.

Figure 2B:
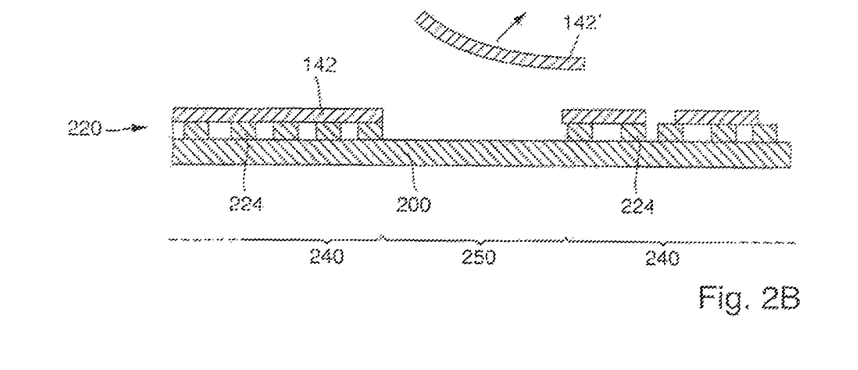

FIG. 2B shows a vertical section through a detail of the laminate structured by a laser. Once the laser beam has completely severed the metal foil at the desired boundaries of the first regions, relatively large contiguous pieces of foil 142' that are no longer joined together with the adhesively attached conductor foil and can be easily detached are obtained in laterally extended second regions. In the first regions, where an electrical conductor structure is desired, the conductor foil firmly bonds to the substrate 200 by way of the structured layer of adhesive in the region of the bonding zones 224. As can be seen in the left-hand part of FIG. 2B, the laser cut may take place exactly at the boundary between an area region partially coated with adhesive material and the adhesive-free second region so that the periphery of the conductor foil is flush with peripheries of bonding zones. In the right-hand part of the figure it is indicated however that this is not imperative. It is also possible that the conductor foil extends with its periphery beyond bonding zones lying thereunder, or that individual bonding zones protrude under the cut periphery of the conductor foil.

After the laser structuring operation, relatively large contiguous pieces of foil 142' from the second regions initially remain loosely on the substrate. They are later gently removed from the substrate with the aid of the downstream cleaning device 160. A suction-removing installation, which sucks away the loose pieces of foil exclusively by a stream of air or negative pressure, may be used, for example, as the cleaning device. In the example, the cleaning device has a cleaning roller 162 working by negative pressure and positive pressure. The cleaning roller has a gas-permeable outer roller and a roller core with a negative-pressure chamber 166 and a positive-pressure chamber 167 to suck up pieces of foil by negative pressure in a suction-attaching portion (close to the substrate in the region of the negative-pressure chamber), transport them into a releasing portion (away from the substrate in the region of the positive-pressure chamber) and release them there by positive pressure. The released pieces of foil are transported away by a stream of air by a suction-removing device 168.

The strip cleaned in this way, comprising multilayer elements, is wound up in the winding-up device 180B onto the winding roller 182B, and can then be transported in roll form for further processing (for example, singulating).

The partial application of adhesive in the first regions may be adapted to the respective requirements with regard to many different parameters. In particular, the spatial distribution of bonding zones or bonding islands in the lateral direction and also the size of the bonding zones and their form may be varied within wide limits. In FIGS. 4A to 4E, some variants of a partial application of adhesive, which may be provided, for example, in the straight portions IV of the meandering conductor regions of the RFID antenna from FIG. 3A or elsewhere, are represented by way of example.

Figure 4A:
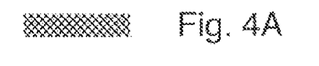

FIG. 4A shows an example in which the bonding zones shown as dark have a square form and alternate with the light-appearing adhesive-free intermediate regions in the manner of a checkerboard pattern. As a result, a degree of coverage of about 50% is achieved, the density of the bonding zones being constant over the entire width including the peripheral zones.

Figure 4B:
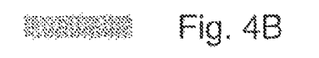

In a variant from FIG. 4B, polygonal or round bonding zones are in a stochastic distribution, the area density or the degree of coverage being approximately constant over the entire width shown. The degree of coverage is generally 10% to 90%, here at approximately 50%.

Figure 4C:
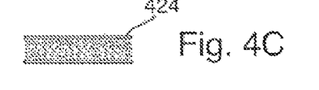
Figure 4D:
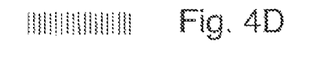

FIG. 4D shows an example in which the bonding zones are in the form of lines running parallel to one another between which there remain intermediate regions, the width of which is greater than the line width of the bonding zones. In this hatched structure, the degree of coverage may, for example, be about 20% to 95% (here at approximately 30%) and can be varied by variation of line widths and/or line spacings.

Figure 4E:
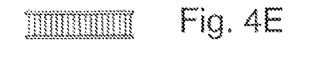

FIG. 4C shows a variant of the distribution shown in FIG. 4B, the adhesive forming in the lateral peripheral zones of the first region in strip form a long linear bonding zone 424 following the contour of the periphery of the first region. This configuration has the effect of strengthening the bonding between adhesively attached conductor foils and the substrate at the periphery of the first regions remaining on the substrate so that a detachment of these peripheral regions after the laser structuring is avoided even more reliably than in variants without peripheral zone strengthening and, in addition, lateral sealing of the only partially adhesive-covered first regions is created. FIG. 4E shows a corresponding strengthening of the peripheral zones in an application of adhesive with a hatched structure. The variants of FIGS. 4C and 4E may also be described by saying that the degree of coverage along the outer contour is 100% and in the interior of the first regions, that is to say between the peripheral regions, has a much lower value which, for example, is 20% to 60%.

There may be corresponding distributions of adhesive not only in the meandering regions of the RFID antenna, but also in other regions, for example, in the much greater contiguous foil regions lying alongside. It is also possible that two or more zones with different bonding zone distributions exist within the first regions. For example, the distributions shown in FIG. 4 may only be present in the relatively narrow meandering regions, while in the adjacent greater contiguous regions a smaller area density of bonding zones or a small degree of coverage may be provided.

There are many applications in which a single adhesive material is sufficient to create all the bonding zones of the laminate. In this case it is sufficient if a single adhesive applying device is provided suitable, for example, for flexographic printing or the inkjet process and applying the adhesive in all the desired regions. In the example with the first subsystem 100A, in addition to a first adhesive applying device 130A there is provided a directly downstream second adhesive applying device 130B. This provides the possibility of applying two different adhesive materials, normally in different regions of the substrate, between the unrolling of the substrate from the storage roller 122A and the laminating on of the conductor foil 142. In the example, the first adhesive applying device 130A applies first bonding zones of a first adhesive material in all of the first regions with the exception of the contacting region 260. The four portions 260A to 260D within the contact region are not coated by the first adhesive applying device. The second adhesive applying device 130B exclusively coats the portions 260A to 260D of the contacting region 260 by a second adhesive material having a higher temperature resistance than the first adhesive material. Adhesive materials or combinations of different adhesive materials may be selected according to different criteria, for example, temperature resistance, brittleness in the cured state and/or degree of shrinkage during curing.

The second adhesive material is also only applied partially in the form of second bonding zones 224B. The two-stage application of adhesive produces a laterally structured multilayer of adhesive, in which the more temperature-resistant second bonding zones within the contacting region 260 keep the conductor foil firmly on the substrate even when an RFID chip or some other component is applied to the contact portions 260A to 260D under the effect of temperature in a downstream component-loading operation by soldering, bonding or in some other way.

It would also be possible to apply the relatively expensive, temperature-resistant second adhesive in the contacting region 260 not only partially but over the full surface area, while in the first regions adjacent thereto the first adhesive is only applied partially. Since the contact regions have only relatively small surface areas, this is possible without considerable extra costs.

Figure 5:
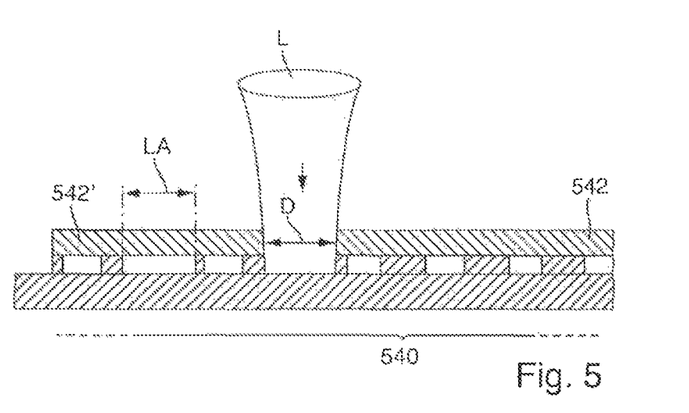
FIG. 5 shows the laser machining in a small second region with conductor tracks and narrow line spacings.

In RFID antennas or other conductive structures that can be produced on a laminate basis, there may be first regions 540 distinguished by the fact that on the finished multilayer element narrow, linear conductor tracks 542' are intended to run parallel to one another with small lateral line spacings LA (cf. FIG. 5). The line spacings may, for example, be below 300 to 500 µm. Such a line structure with narrow line spacings may be created by the material of the conductor foil 542 in the regions between the conductor tracks being completely vaporized by laser ablation. In this case of second regions that are very narrow, that is to say not laterally extended, no remains of foil that later have to be cleaned away are left behind. In this laser machining operation, if appropriate the adhesive lying thereunder of the bonding zones may also be partially or completely vaporized. However, this is not imperative and often not envisaged so that on the finished product there may be remains of adhesive between the conductor tracks.

If the removal profile of the laser beam L or the removal diameter D effective for the removal is less than the desired line spacings, the second regions between the conductor lines may, for example, be passed over in a meandering form over the full surface area to achieve wider removal regions. Such operations are possible with laser machining devices in which the laser beam is set to a fixed beam diameter in the focal area.

It may however be advisable to use a different laser configuration to carry out cutting of the outer contours along the boundaries of the first regions than for the structuring in the region of thin lines and narrow line spacings. To carry out machining with a different laser configuration, it may, for example, be possible to use two different lasers with the same wavelength or different wavelengths and/or different pulse durations. For this purpose, a second laser machining device may be arranged upstream or downstream of a first laser machining device.

In the example, however, the laser machining system of the laser machining device 150 can be switched over between different operating modes by way of the control. In particular, there is the possibility of changing the beam diameter in the machining plane or in the focal area infinitely variably. A variable beam expander 156 or a focus shifter may be provided, for example, for this. It is then possible, for example, when passing over the boundaries of the first regions to work with a focus diameter of 50 µm to 100 µm, and to increase the focus diameter for the machining of second regions of narrow line spacings to a greater value, for example, of the order of magnitude of 300 µm. The greater beam diameter may also be used in the scanning operation to remove relatively large contiguous regions of the conductor foil.

Figure 6:
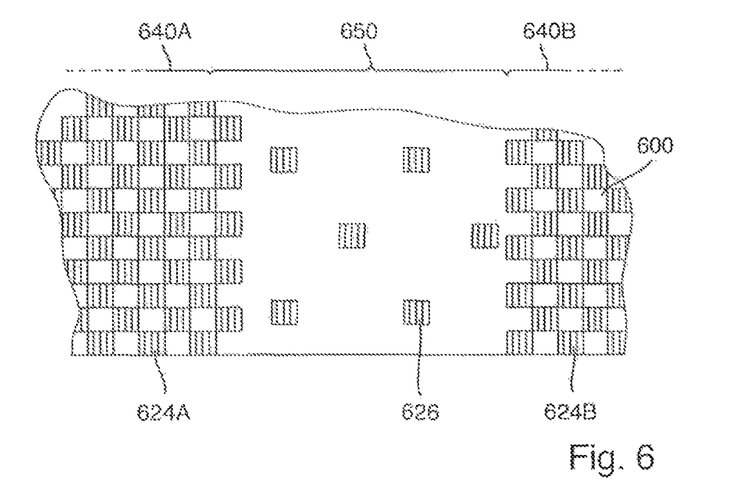
FIG. 6 shows a plan view of an example in which there are laterally extended second regions with a low degree of coverage of bonding zones along with first regions with a high degree of coverage of bonding zones.

In the graphically represented examples with regard to the examples, in the first regions there is a partial application of adhesive with bonding zones, while the laterally extended second regions are not coated with adhesive material and also remain free of adhesive on the finished product. The pieces of foil detached from the laterally extended second regions then lie loosely on the structured laminate after the structuring operation. If this is to be avoided, it is also possible to create a partial bonding contact between the substrate and the conductor foil in the laterally extended second regions intended to be electrically non-conductive on the end product at a multiplicity of bonding zones distributed over the extended second region. To nevertheless ensure reliable detachment of the pieces of foil during the cleaning operation, the bonding force in the laterally second extended regions should be much less compared to the bonding force in the first regions. This can be achieved, for example, by bonding zones of a small surface area lying relatively far apart from one another, for example, to achieve a degree of coverage at a maximum of 10% or at a maximum of 20%. FIG. 6 shows in this respect by way of example a schematic plan view of a substrate 600, which has between two first regions 640A and 640B with a checkerboard pattern of first bonding zones 624A, 624B (degree of coverage 50%) a laterally extended second region 650 in which there are isolated smaller second bonding zones 626, the lateral distances between which are greater by a multiple in all directions than the maximum diameters of the bonding zones. This allows smaller degrees of coverage to be achieved in the second regions, for example, of the order of magnitude of 5% to 20%.

In this variant, possible problems that arise due to undefined detachment of unrequired pieces of foil that have already been cut out can be reliably avoided since the pieces of foil to be removed are still attached at the widely distributed second bonding zones 626 after the laser structuring operation, until they are detached by the cleaning device.

FIGS. 1A and 2A show only a few devices of the system as a whole. With the configuration shown and other configurations, the system may have further devices or modules. For example, a pre-cleaning device to clean the substrate directly before application of adhesive may also be provided between the unwinding device 120A and the adhesive applying device 130. One or more adhesive post-treatment devices may also be provided between the adhesive applying device and the laminating device. For example, a drying device may be provided to dry an adhesive that is still too moist after the application of adhesive but before the lamination. When using adhesives only activated by a post-treatment, a corresponding activation unit may be provided. When using an adhesive that can be activated by ultraviolet radiation, for example, a UV radiation unit may be provided. After cleaning off the finished-structured substrate web, the finished multilayer elements may be singulated by a cutting device which may be arranged between the cleaning device 160 and the winding-up device 182B.

Dividing the system as a whole into two spatially separate subsystems may be favorable in some setups for process engineering reasons and/or for reasons of space, but is not imperative. In other examples, the intermediate winding-up stage is no longer provided so that all of the machining operations take place in a continuous production line on the substrate web running through, without interim winding up.

Instead of a roller-to-roller process, a sheet-processing process (sheet-to-sheet process) may also be used.

The invention claimed is:

1. A method of producing a multilayer element with a substrate and at least one conductor structure connected in an areal manner to the substrate, which has first regions of electrically conductive material present in accordance with a prescribed pattern, electrically non-conductive second regions lying between the first regions to produce RFID antennas or flexible printed circuit boards in a roller-to-roller process, the method comprising:
  connecting a conductor foil to the substrate by a laterally structured layer of adhesive lying in between such that in the first regions a partial bonding contact between the substrate and the conductor foil is created at a multiplicity of bonding zones, and in laterally extended second regions the conductor foil is not connected or is connected less firmly by adhesive to the substrate;
  structuring the conductor foil by cutting the conductor foil along boundaries of the first regions; and
  removing contiguous pieces of foil of the conductor foil from the laterally extended second regions, whereby regions forming the prescribed pattern remain adhesively attached at the bonding zones of the first regions and adhesive-free intermediate regions lying between the bonding zones in the first regions are bridged by the conductor foil.

2. The method as claimed in claim 1, wherein an area fraction of the adhesive to create the bonding zones within the first regions is 10% to 90%.

3. The method as claimed in claim 1, wherein no adhesive is applied in regions corresponding to the laterally extended second regions so that the regions are free of adhesive on the finished multilayer element.

4. The method as claimed in claim 1, wherein, in regions corresponding to the laterally extended second regions, adhesive is applied in accordance with a prescribed pattern to create in the laterally extended second regions a spatial distribution of bonding zones with adhesive-free intermediate regions lying in between.

5. The method as claimed in claim 4, wherein adhesive is applied such that an area fraction of adhesive to create the bonding zones within the laterally extended second regions is less than 10% while an area fraction of bonding zones in the first regions is 20% or more.

6. The method of claim 1, wherein an adhesive material is applied in the first regions to create the bonding zones partially in accordance with a prescribed pattern, the pattern contains a regular or irregular pattern of points or is formed by such a pattern, and/or the pattern contains a regular or irregular pattern of lines or is formed by such a pattern.

7. The method of claim 1, wherein the layer of adhesive is applied in some or all of the first regions such that, in a region of peripheral zones of the first regions, linear bonding zones adapted to a path of a periphery are created.

8. The method of claim 1, wherein a laterally structured multilayer of adhesive is created, which in a region of first bonding zones consists of a first adhesive material and in a region of second bonding zones, separate from the first, consists of a second adhesive material, that differs from the first adhesive material.

9. The method of claim 1, wherein the laterally structured layer of adhesive is applied to the substrate or the conductor foil by a jet printing process or a flexographic printing process.

10. The method of claim 1, wherein, to structure the conductor foil, laser radiation is radiated along boundaries of the first regions by a laser machining system.

11. The method of claim 1, wherein, when passing over boundaries of the first regions, a laser machining system is operated in a first operating mode and, for machining other regions, is changed over from the first operating mode into a second operating mode.

12. A system that produces a multilayer element with a substrate and at least one conductor structure connected in an areal manner to the substrate, which has first regions of electrically conductive material present in accordance with a prescribed pattern, electrically non-conductive second regions lying between the first regions to produce RFID antennas or flexible printed circuit boards in a roller-to-roller process, comprising:
  devices that connect a conductor foil to the substrate by a laterally structured layer of adhesive lying in between such that in the first regions there is a partial bonding contact between the substrate and the conductor foil at a multiplicity of bonding zones, and in laterally extended second regions the conductor foil is not connected or connects less firmly by adhesive to the substrate;
  a device that structures the conductor foil by cutting the conductor foil along boundaries of the first regions; and
  a cleaning device that removes pieces of foil of the conductor foil from the laterally extended second regions, whereby regions forming the prescribed pattern remain adhesively attached at the bonding zones of the first regions and adhesive-free intermediate regions lying between the bonding zones in the first regions are bridged by the conductor foil.

13. The system as claimed in claim 12, wherein the devices that connect the conductor foil to the substrate have at least one adhesive applying device that applies the layer of adhesive to the substrate and/or the conductor foil, the at least one adhesive applying device designed such that the layer of the at least one adhesive in the first regions forms the multiplicity of bonding zones with adhesive-free regions lying in between.

14. The system as claimed in claim 12, wherein the devices that connect the conductor foil to the substrate have a first adhesive applying device that applies a first adhesive material to create first bonding zones and at least one second adhesive applying device that applies a second adhesive to create second bonding zones, separate from the first.

15. The system as claimed in claim 13, further comprising the at least one adhesive applying device having a flexographic printing unit or a jet printing unit that applies the laterally structured layer of adhesive.

16. The system of claim 12, wherein the device that structures the conductor foil has a laser machining system.

17. A multilayer element comprising an RFID antenna or a flexible printed circuit board produced by the method of claim 1.

18. The multilayer element as claimed in claim 17, further comprising the substrate and the at least one conductor structure connected to the substrate by the layer of adhesive and having the first regions of electrically conductive material present on the layer of adhesive in accordance with a prescribed pattern, the electrically non-conductive second regions lying adjacent to first regions,
  in some or all of the first regions the multiplicity of bonding zones of the layer of adhesive being present in a distributed manner in accordance with a prescribed pattern, and adhesive-free intermediate regions between the bonding zones.

19. The multilayer element as claimed in claim 18, wherein the laterally extended second regions are free of adhesive material.

* * * * *